(12) United States Patent
Kim et al.

(10) Patent No.: US 7,263,026 B2
(45) Date of Patent: Aug. 28, 2007

(54) SEMICONDUCTOR MEMORY DEVICE AND METHOD FOR CONTROLLING THE SAME

(75) Inventors: Min-Soo Kim, Seoul (KR); Myeong-O Kim, Gyeonggi-do (KR); Jae-Woong Lee, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/327,247

(22) Filed: Jan. 5, 2006

(65) Prior Publication Data

US 2006/0146619 A1    Jul. 6, 2006

(30) Foreign Application Priority Data

Jan. 6, 2005    (KR) ................. 10-2005-0001092

(51) Int. Cl.
*G11C 7/00* (2006.01)

(52) U.S. Cl. .................................. 365/233; 365/233.5

(58) Field of Classification Search ................ 365/233, 365/233.5, 194

See application file for complete search history.

(56) References Cited

U.S. PATENT DOCUMENTS

| 5,548,560 | A | * | 8/1996 | Stephens et al. | ......... | 365/233.5 |
| 5,835,448 | A | * | 11/1998 | Ohtani et al. | ............... | 365/233 |
| 6,055,207 | A | * | 4/2000 | Nam | ........................... | 365/233 |
| 6,185,151 | B1 | * | 2/2001 | Cho | ............................ | 365/233 |
| 7,075,854 | B2 | * | 7/2006 | Lee et al. | ................... | 365/233 |

* cited by examiner

*Primary Examiner*—Vu A. Le
(74) *Attorney, Agent, or Firm*—Marger Johnson & McCollom, P.C.

(57) ABSTRACT

A control unit for a semiconductor memory device, a semiconductor memory device and a method for controlling the same. The control unit of a semiconductor memory device includes control signal circuits, each control signal circuit to receive a master signal and to generate at least one of a plurality of control signals in response to the master signal, each of the plurality of core control signals to be generated after a delay specific to the core control signals after a transition of the master signal, the plurality of control signals to control the semiconductor memory device.

19 Claims, 5 Drawing Sheets

SEMICONDUCTOR MEMORY DEVICE AND METHOD FOR CONTROLLING THE SAME

CROSS-REFERENCE TO RELATED APPLICATION

This application claims the benefit of Korean Patent Application No. 10-2005-0001092, filed Jan. 6, 2005, the disclosure of which is hereby incorporated herein by reference in its entirety.

BACKGROUND

1. Technical Field

This application relates to semiconductor memory devices, methods for controlling the same, and more particularly, to a semiconductor memory device and a method for controlling the same in which core control signals controlling read or write operations in semiconductor memory devices are enabled by one master signal.

2. Discussion of Related Art

In general, read and write operations in semiconductor memory devices are performed repeatedly. In the read operation, data in selected memory cells is read from the semiconductor memory device. In the write operation, external input data is stored in selected memory cells. Data input and output speed of semiconductor memory devices are key factors in determining the operational speed of a system that uses the semiconductor memory devices. Studies for improving the operational speed of semiconductor memory devices are ongoing. These studies have resulted in synchronous semiconductor memory devices (e.g., synchronous DRAMs; SDRAMs) having internal circuits synchronized with an external clock signal.

The synchronous semiconductor memory devices may be classified into single data rate synchronous memory devices (single data rate SDRAM; SDR SDRAM) and double data rate synchronous memory devices (double data rate SDRAM; DDR SDRAM). In SDR SDRAM, one set of data is input or output during one cycle of an external clock signal in response to a rising edge or a falling edge of the external clock signal. The DDR SDRAM, two sets of data are input or is output during one cycle of an external clock signal, one in response to a rising edge and one in response to a falling edge of the external clock signal. Consequently, DDR SDRAM may have a bandwidth that is two times greater than that of SDR SDRAM.

Several control signals are necessary for read and write operations in a semiconductor memory device. The semiconductor memory device is generally divided into a cell array area, a core area and a ferry area. The control signals are called core control signals since most of the control signals are generated in the core area.

FIG. 1 is a schematic block diagram of a data input and output path from a memory cell to input and output lines and associated circuits in a synchronous semiconductor memory device.

The data input and output path will be described with reference to FIG. 1. First, a data output path when data in a memory cell 10 is read in a read operation in a semiconductor memory device will be described.

The memory cell 10 is basically composed of one transistor and one capacitor. When a word line WL is selected and enabled in response to a row address, the transistor of the memory cell 10 is turned on and data in the capacitor is loaded on a bit line BL. The bit line BL forms a bit line pair with a complementary bit line BLB. The data on the bit line BL is sensed and amplified by a bit line sense amplifier 20. The amplified data on the pair of bit lines BL and BLB is loaded onto a pair of local input and output lines LIO and LIOB via transistors N1 and N2 responsive to a column select signal (CSL). For example, when the column select signal CSL for a specific column is enabled by a column address, data on bit line pair BL and BLB of the column is loaded onto the local input and output lines LIO and LIOB. The loaded data on the pair of the local input and output line LIO and LIOB is sensed and amplified by an input and output sense amplifier 40. Here, it is necessary to precharge the pair of the local input and output lines LIO and LIOB by means of the local input and output line precharge circuit 30 responsive to a local input and output line precharge signal LIOPRB before the column select signal CSL is enabled so that the sense amplifier 40 correctly senses data. The amplified data from the input and output sense amplifier 40 is loaded onto a pair of global input and output lines GIO and GIOB and is output outside the memory device. It is also necessary to precharge the global input and output lines GIO and GIOB prior to data transmission by means of the global input and output line precharge circuit 50 responsive to the global input and output line precharge signal GIOPRB.

A data input path, when data is written to a semiconductor memory cell, will be now described. When external data is input at the start of a write operation, the global input and output line driver circuit 60 sends external input data to the global input and output line pair GIO and GIOB. The global input and output line driver circuit 60 is enabled in response to a first data loading signal PDT. The data on the global input and output line pair GIO and GIOB is loaded to the local input and output line pair LIO and LIOB by a local input and output line driver circuit (not shown) responsive to a second data loading signal LGIOCON. The data on the local input and output line pair LIO and LIOB is loaded to the bit line pair BL and BLB by the transistors N1 and N2 responsive to the column select signal CSL and is stored in the memory cell 10.

As described above, to perform such read and write operations, the semiconductor memory device requires core control signals controlling the data input and output path.

Examples of the core control signals include a read/write identifying signal PWRD for identifying reading operation and writing operation, a first data loading signal PDT, a second data loading signal LGIOCON, input and output line precharge signals LIOPRB and GIOPRB for precharging input and output lines LIO, LIOB, GIO and GIOB, a sense amplifier enable signal LSAEN for enabling an input and output line sense amplifier, and a column select signal CSL for data transmission between a bit line pair BL and BLB and local input and output lines LIO and LIOB. These core control signals are generated in control signal generating circuits responsive to a master signal.

As used herein, a master signal is a signal for controlling generation of specific control signals. For example, a signal input to the column select signal CSL generating circuit in order to enable or disable the column select signal CSL is called a master signal for the column select signal CSL.

FIG. 2 is a timing diagram illustrating generation of the control signals.

As shown in FIG. 2, when an external clock signal CLK is applied, an internal clock signal PCLK is generated in synchronization with the external clock signal CLK. When read or write operation is initiated, a bank address BA for selecting one of memory banks constituting a cell array of a semiconductor memory device, and a first control signal PCLKCD as a delayed version of the internal clock signal PCLK are generated in response to a rising edge of the internal clock signal PCLK. Further, a second control signal PCSLD as a delayed version of the internal clock signal PCLK is generated in response to a rising edge of the next cycle of the internal clock signal. The column select signal CSL is enabled with a certain delay in response to a rising edge of the first control signal PCLKCD as a master signal and disabled with a certain delay in response to a rising edge of a second control signal PCSLD as a master signal. Core control signals IOPR and PWRD are enabled with a certain delay in response to a rising edge of the bank address signal BA as the master signal and disabled with a certain delay in response to a falling edge of the bank address signal BA. The core control signal IOPR is a complementary signal of input and output line precharge signals LIOPRB and GIOPRB. Other core control signals PDT, LGIOCON and LSAEN, which are not shown, either have a different master signal, or one of the above-described master signals.

As described above, the core control signals LIOPRB, GIOPRB, PWRD, PDT, LGIOCON and LSAEN have a different master signal from that for the column select signal CSL. Delay variation or power, voltage, and temperature (PVT) variation in core control signal generation circuits result in increased design time for the master signals. In addition, in the delay variation or the PVT variation makes it difficult to obtain the absolute margin between the signals.

SUMMARY

Embodiments include a control unit of a semiconductor memory device including control signal circuits, each control signal circuit to receive a master signal and to generate at least one of a plurality of control signals in response to the master signal, each of the plurality of core control signals to be generated after a delay specific to the core control signals after a transition of the master signal, the plurality of control signals to control the semiconductor memory device.

Other embodiments include semiconductor memory devices and methods of controlling semiconductor memory devices using the aforementioned control unit.

BRIEF DESCRIPTION OF THE DRAWINGS

The above and other features and advantages of the invention will become more apparent to those of ordinary skill in the art by describing in detail preferred embodiments thereof with reference to the attached drawings in which.

DETAILED DESCRIPTION

Embodiments will now be described with reference to the accompanying drawings, in which preferred embodiments are shown. However, the invention should not be construed as limited to only the embodiments set forth herein. Rather, these embodiments are presented as teaching examples.

Figure 1:
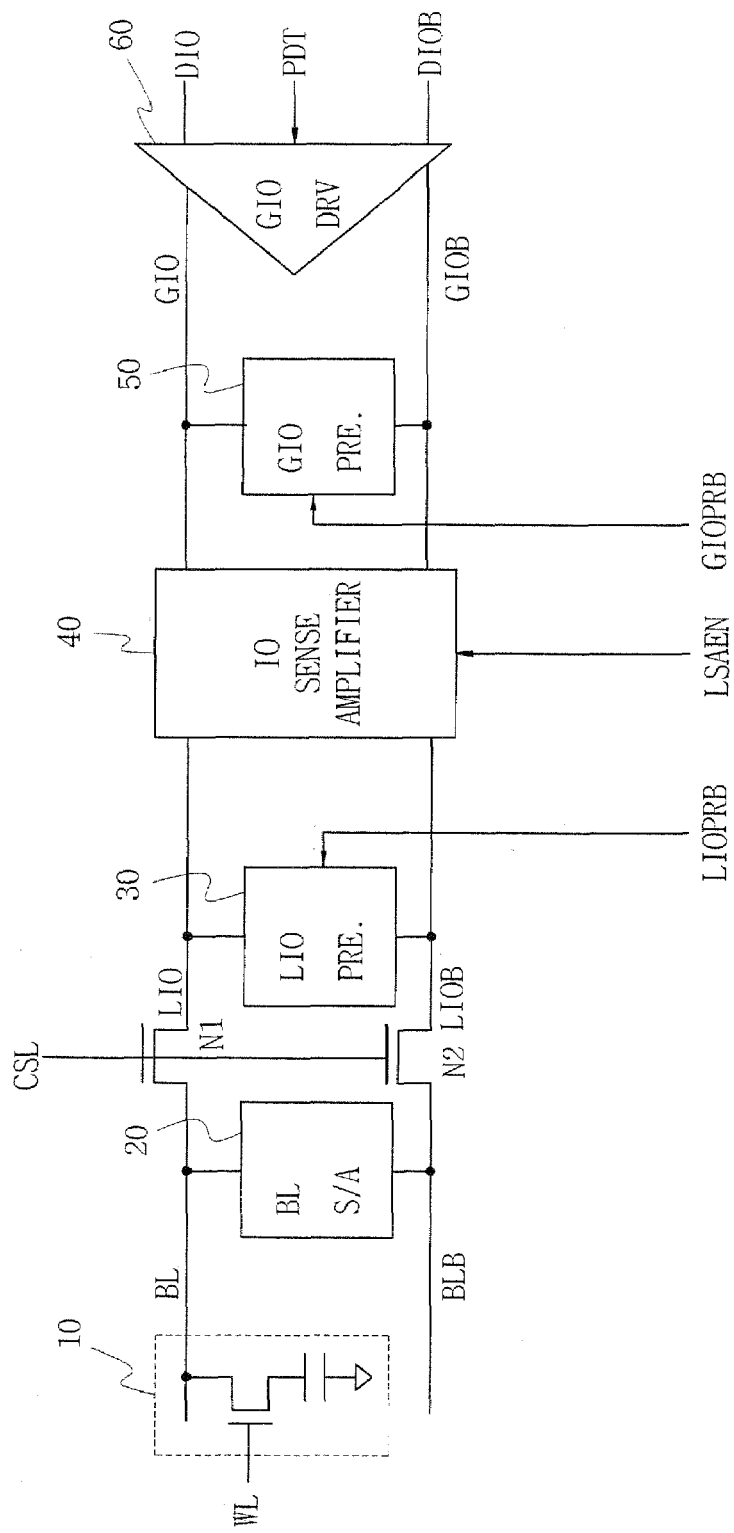
FIG. 1 is a schematic block diagram of a data input and output path from a memory cell to input and output lines and associated circuits in a typical synchronous semiconductor memory device.
Figure 2:
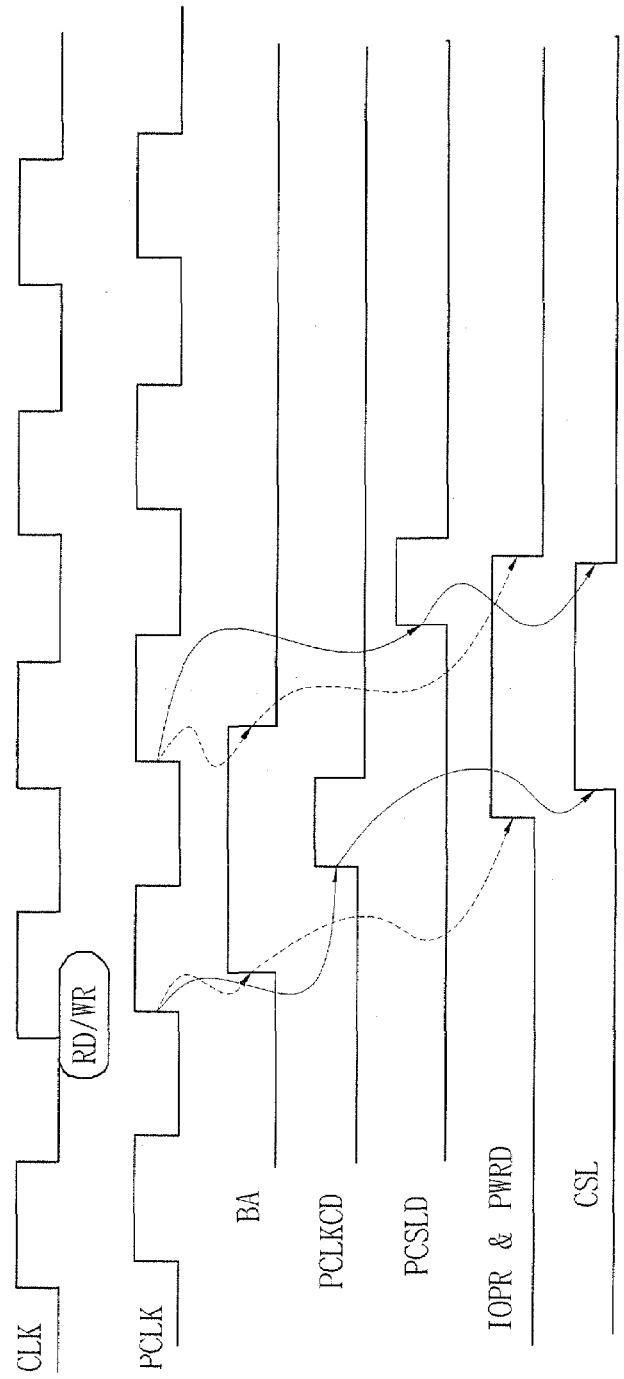
FIG. 2 is a timing diagram of core control signals for controlling the circuits of FIG. 1.
Figure 3:
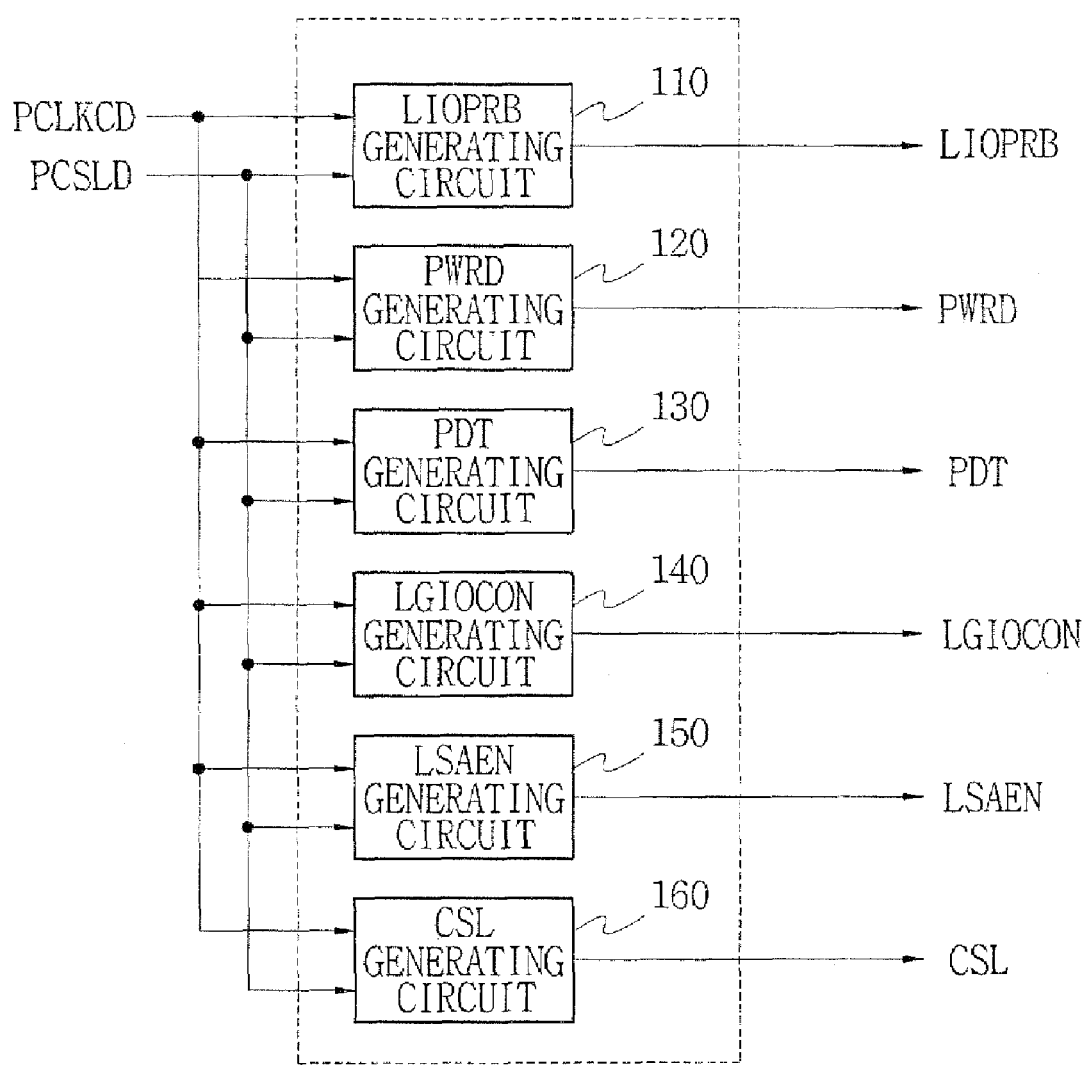
FIG. 3 is a block diagram of a control unit in a semiconductor memory device according to an embodiment.

FIG. 3 is a block diagram of a control unit 100 for generating core control signals in a semiconductor memory device. The semiconductor memory device includes an array of a memory cells, and a number of other circuits, in addition to the circuits for controlling the data input and output path of FIG. 1. In the following discussion, only portions of the semiconductor memory device sufficient to enable one skilled in the art to understand the invention will be described.

As shown in FIG. 3, the control unit 100 of the semiconductor memory device includes an input and output line precharge signal (LIOPRB) generating circuit 110, a read/write identifying signal (PWRD) generating circuit 120, a first data loading signal (PDT) generating circuit 130, a second data loading signal (LGIOCON) generating circuit 140, an input and output line sense amplifier enable signal (LSAEN) generating circuit 150, and a column select signal (CSL) generating circuit 160. Although the listed control signals will be described below, one of ordinary skill in the art will understand that embodiments may encompass other control signals used in controlling a semiconductor memory device.

The core control signals LIOPRB, PWRD, PDT, LGIOCON, LSAEN and CSL are enabled in response to a first master signal PCLKCD after a delay specific to each core control signal and are disabled in response to a second master signal PCSLD after another delay specific to each core control signal. The first master signal PCLKCD is a single pulse delayed from an edge of an internal clock signal synchronized to an external clock signal. The second master signal PCSLD is also a single pulse delayed from an edge of the internal clock signal, generated after the first master signal PCLKCD is generated.

The input and output line precharge signal (LIOPRB) generating circuit 110 is configured so that the input and output line precharge signal LIOPRB is enabled in response to the first master signal PCLKCD after a delay and is disabled in response to the second master signal PCSLD after another delay. The input and output line precharge signal LIOPRB is a control signal for precharging an input and output line to a specific voltage. The input and output line precharge signal LIOPRB may include the precharge signal LIOPRB for the pair of the local input and output lines LIO and LIOB, and the precharge signal GIOPRB for the pair of the global input and output lines GIO and GIOB of FIG. 1. Alternatively, the input and output line precharge signal LIOPRB may include only the precharge signal LIOPRB for the pair of the local input and output lines LIO and LIOB. The input and output line precharge signal (LIOPRB) generating circuit 110 having the above-described function may be implemented in various methods by those skilled in the art.

The read/write identifying signal (PWRD) generating circuit 120 is configured so that the read/write identifying signal PWRD is enabled in response to the first master signal PCLKCD after a delay and disabled in response to the second master signal PCSLD after another delay. The read/write identifying signal PWRD is a signal that indicates whether a read or write operation is to be performed. For example, the read/write identifying signal PWRD at a high level may indicate that the write operation is to be performed while the read/write identifying signal PWRD at a low level may indicate that the read operation is to be performed. The read/write identifying signal (PWRD) generating circuit 120 having the above-described function may be implemented in various methods by those skilled in the art.

The first data loading signal (PDT) generating circuit 130 is configured so that the first data loading signal PDT is enabled in response to the first master signal PCLKCD after a delay and is disabled in response to the second master signal PCSLD after another delay. The first data loading signal PDT is a master signal for loading external input data onto the input and output lines in the writing operation. For example, where the input and output line is divided into the local input and output lines LIO and LIOB and the global input and output lines GIO and GIOB as in FIG. 1, the first data loading signal PDT loads the data onto the pair of the global input and output lines GIO and GIOB. The first data loading signal (PDT) generating circuit 130 having the above-described function may be implemented in various methods by those skilled in the art.

The second data loading signal (LGIOCON) generating circuit 140 is configured so that the second data loading signal LGIOCON is enabled in response to the first master signal PCLKCD after a delay and is disabled in response to the second master signal PCSLD after another delay. The second data loading signal LGIOCON is a signal for loading the data on the global input and output line GIO and GIOB onto the local input and output lines LIO and LIOB in the write operation. The second data loading signal LGIOCON, when enabled, loads the data on the global input and output lines GIO and GIOB onto the input and output lines LIO and LIOB. The second data loading signal (LGIOCON) generating circuit 140 having the above-described function may be implemented in various methods by those skilled in the art.

The input and output sense amplifier enable signal (LSAEN) generating circuit 150 is configured so that the input and output sense amplifier enable signal LSAEN is enabled in response to the first master signal PCLKCD after a delay and is disabled in response to the second master signal PCSLD after another delay. The input and output sense amplifier enable signal LSAEN is a signal for enabling the input and output sense amplifier in the read operation in order to perform a data sensing and amplifying operation. The input and output sense amplifier enable signal LSAEN generating circuit 150 having the above-described function may be implemented in various methods by those skilled in the art.

The column select signal CSL generating circuit 160 is configured so that the column select signal CSL is enabled in response to the first master signal PCLKCD after a delay and disabled in response to the second master signal PCSLD after another delay. The column select signal CSL is a signal for controlling data transmission between bit lines BL and BLB and the input and output lines LIO and LIOB. The column select signal CSL loads the data on the bit line BL and BLB onto the input and output lines LIO and LIOB in the read operation and the data on the input and output lines LIO and LIOB onto the bit lines BL and BLB in the write operation. For example, a high column select signal CSL may allow data transmission between the bit lines BL and BLB and the local input and output lines LIO and LIOB. The column select signal (CSL) generating circuit 160 having the above-described function may be implemented in various methods by those skilled in the art.

The core control signals LIOPRB, PWRD, PDT, LGIOCON, LSAEN and CSL, which are enabled and disabled in response to the first master signal PCLKCD and the second master signal PCLSD, each may have independent delays, one for delaying enabling and another for delaying disability. Each delay may be individually set to be suitable for the operation of the semiconductor memory device.

Figure 4:
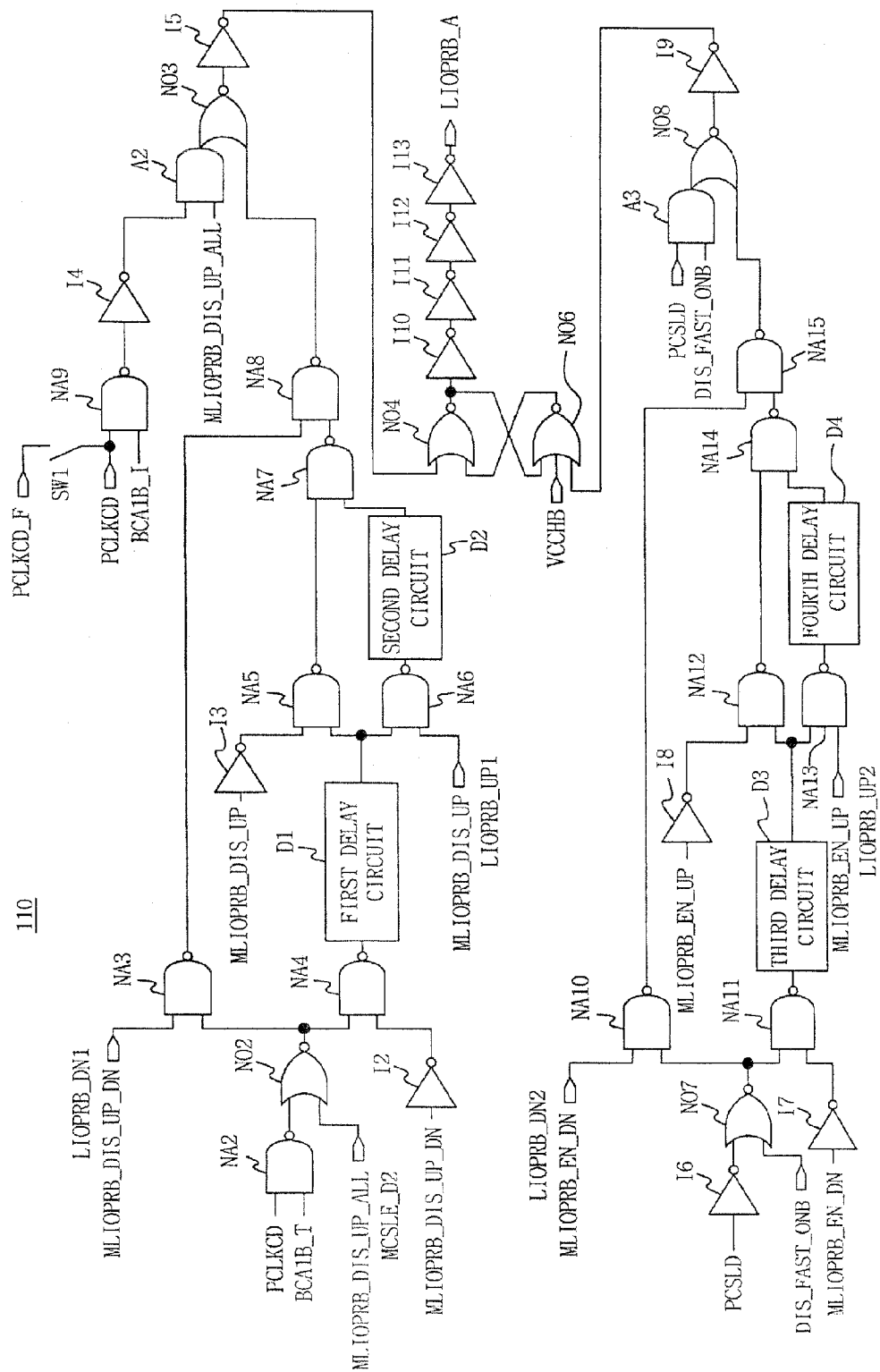
FIG. 4 is a circuit diagram of an input and output precharge signal generating circuit constituting the control unit of FIG. 3.

FIG. 4 illustrates an exemplary implementation of an input and output precharge signal (LIOPRB) generating circuit 110 constituting the control unit.

The input and output line precharge signal (LIOPRB) generating circuit 110 may be implemented as a circuit having a connection structure as shown in FIG. 4 that includes logic NAND circuits NA2 to NA15, logic NOR circuits NO2 to NO8, inverter circuits I2 to I13, first to fourth delay circuits D1 to D4, and logic AND circuits A2 and A3.

While an exemplary implementation of the input and output line precharge signal (LIOPRB) generating circuit 110 is illustrated in FIG. 4, other circuits constituting the control unit 100, i.e., the read/write identifying signal (PWRD) generating circuit 120, the first data loading signal (PDT) generating circuit 130, the second data loading signal (LGIOCON) generating circuit 140, the input and output line sense amplifier enable signal (LSAEN) generating circuit 150, and the column select signal (CSL) generating circuit 160 may be implemented by adjusting the delay of the first to fourth delay circuits D1 to D4 in the configuration of the FIG. 4.

Figure 5:
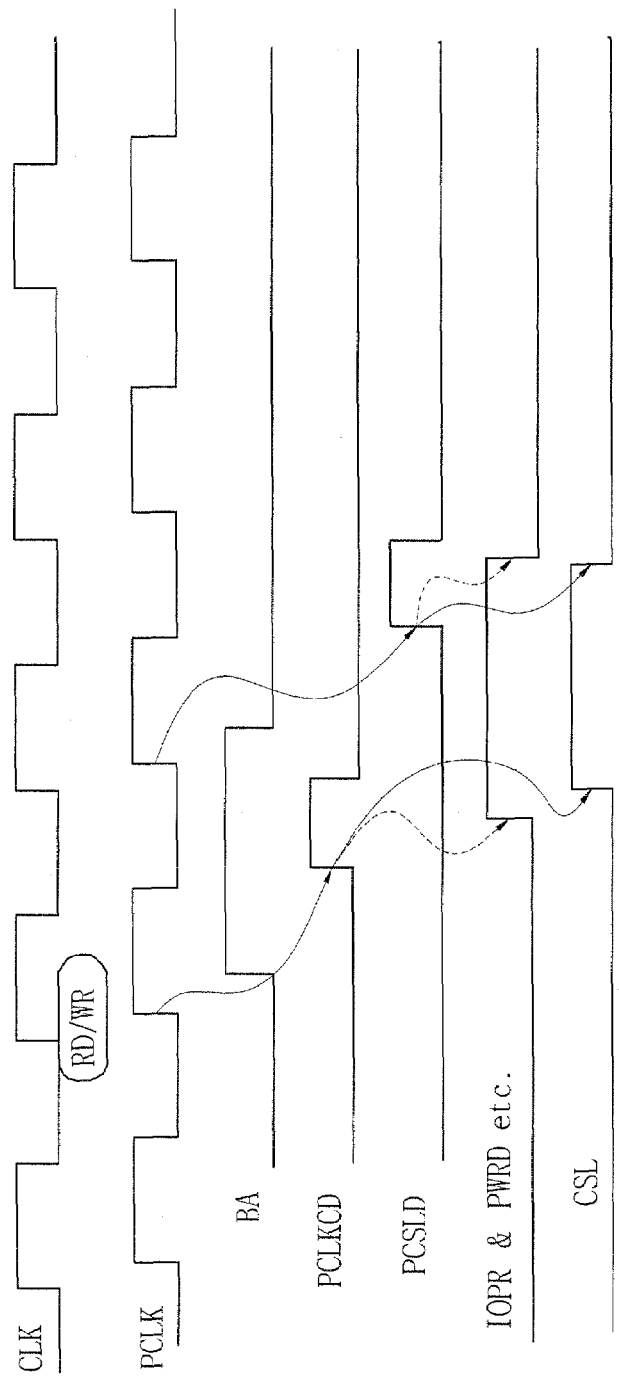
FIG. 5 is a timing diagram showing generation of the core control signals of FIG. 3.

FIG. 5 is a timing diagram of core control signals generated in the control unit of FIG. 3.

Referring to FIG. 5, when an external clock signal CLK is applied, an internal clock signal PCLK is generated in synchronization with the external clock signal CLK. If a read or write operation is initiated, a bank address BA for selecting one of memory banks constituting a cell array of the semiconductor memory device and a first master signal PCLKCD as a delayed version of the internal clock signal PCLK are generated in response to a rising edge of the internal clock signal PCLK. Further, a second master signal PCSLD as a delayed version of the internal clock signal PCLK is generated in response to a rising edge of a next cycle of the internal clock signal.

The column select signal CSL is enabled after a delay in response to a rising edge of a first master signal PCLKCD and is disabled after another delay in response to a rising edge of a second master signal PCSLD. The other core control signals such as IOPR and PWRD are enabled after a delay in response to the rising edge of the first master signal PCLKCD, and are disabled after another delay in response to the rising edge of the second master signal PCSLD, unlike the prior art. Here, the core control signal IOPR is a complementary signal of the input and output line precharge signals LIOPRB and GIOPRB. Similarly, other core control signals PDT, LGIOCON and LSAEN that are not shown are enabled within a delay in response to a rising edge of the first master signal PCLKCD and are disabled within another delay in response to a rising edge of the second master signal PCSLD as another master signal.

As described above, the core control signals may have the same features such as the same delay or PVT variation by enabling the core control signals with a single master signal and disabling the core control signals with another single master signal. As a result, design time is reduced when designing different master signals, and while maintaining a correct absolute margin between the signals.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A semiconductor memory device comprising:
    a cell array of a plurality of memory cells; and
    a control unit for generating a plurality of core control signals in response to a first master signal, each of the plurality of core control signals to be generated after a delay specific to the core control signal after a transition of the first master signal and to be disable in response to a second master signal, the core control signals to control read operations and write operations in the memory cells.

2. The device according to claim 1, wherein:
    each memory cell is connected to a bit line; and
    the core control signals include a column select signal for controlling a connection between the bit line and an input and output line, an input and output line precharge signal for precharging the input and output line, a read/write identifying signal for identifying the read operations and the write operations, an enable signal for an input and output line sense amplifier for sensing and amplifying data on the input and output line, and a data loading signal for loading input data onto the input and output line in the writing operation.

3. The device according to claim 1, wherein the first master signal is generated in response to an internal clock signal synchronized to an external clock signal.

4. The device according to claim 1, wherein the control unit further to enable a column select signal for controlling a connection between a bit line and an input and output line in response to the first master signal.

5. The device according to claim 1, wherein the control unit further to disable a column select signal for controlling a connection between a bit line and an input and output line in response to the second master signal.

6. The device according to claim 1, wherein the control unit further comprises a plurality of control signal circuits, each control signal circuit to enable or disable an associated core control signal, each of the control signal circuits including an enable delay circuit and a disable delay circuit.

7. A semiconductor memory device comprising:
    a cell array of a plurality of memory cells;
    a plurality of bit line pairs for inputting and outputting data to and from the memory cells;
    a plurality of local input and output line pairs for inputting and outputting data to and from the plurality of bit line pairs;
    a global input and output line pair for inputting and outputting data to and from the plurality of local input and output line pairs; and
    a control unit for generating a plurality of core control signals in response to a first master signal and a second master signal, each of the plurality of core control signals to be generated after a delay specific to the core control signals after a transition of the first master signal, the core control signals to control read operations or write operations in the memory cells, the control unit to enable the core control signals in response to the first master signal and to disable the core control signals in response to the second master signal.

8. The device according to claim 7, wherein the core control signals include a column select signal for electrically connecting a selected bit line pair and an associated local input and output line pair, a plurality of input and output line precharge signals for precharging the associated local input and output line pair and the global input and output line pair, a read/write identifying signal for identifying the read operations and the write operations, an enable signal for an input and output line sense amplifier for sensing and amplifying data on the input and output line pairs, a first data loading signal for loading input data onto the global input and output line pair in the write operations, and a second data loading signal for loading input data on the global input and output line pair onto the associated local input and output line pair in the write operations.

9. The device according to claim 7, wherein the first and second master signals each have a different enable period and are generated in response to an internal clock signal.

10. The device according to claim 7, wherein the control unit further comprises a plurality of control signal circuits, each control signal circuit to enable or disable an associated core control signal, each of the control signal circuits including an enable delay circuit and a disable delay circuit.

11. A method for controlling core control signals in a semiconductor memory device having a plurality of memory cells, the core control signals to control read or write operations, the method comprising:
    generating first and second master signals in response to an internal clock signal;
    enabling the core control signals in response to the first master signal, the first master signal being enabled earlier than the second master signal, each core control signal to be enabled after a delay specific to the core control signal after a transition of the first master signal;
    performing predetermined operations in response to the core control signals, the predetermined operations including reading data from the memory cells or writing data to the memory cells; and
    disabling the core control signals in response to the second master signal.

12. The method according to claim 11, wherein the core control signals include a column select signal for selecting a column line, an input and output line precharge signal for precharging an input and output line, a read/write identifying signal for identifying the read operations and the write operations, an enable signal for an input and output line sense amplifier for sensing and amplifying data on the input and output line, a first data loading signal for loading input data onto a global input and output line in the write operation, and a second data loading signal for loading input data on the global input and output line onto a local input and output line in the write operation.

13. The method according to claim 12, wherein the first and second master signals are generated in response to an internal clock signal.

14. A control unit for a semiconductor memory device comprising;
    a plurality of control signal circuits,
        each control signal circuit to receive a first master signal and a second master signal,
        each control signal circuit to enable at least one of a plurality of control signals in response to the first master signal, each of the plurality of core control signals to be enabled after a delay specific to the core control signal after a transition of the first master signal, and each control signal circuit to disable the associated at least one control signal in response to the second master signal, wherein the plurality of control signals are to control the semiconductor memory device.

15. The control unit of claim 14, wherein each control signal circuits further comprises at least one delay element to delay the enabling of the associated at least one control signal.

16. The control unit of claim 15, wherein each of the plurality of control signal circuits further comprises at least one second delay element to delay the disabling of the associated at least one control signal.

17. The control unit of claim 15, wherein each control signal circuit comprises:

a first circuit to receive the first master signal;
a second circuit to receive the second master signal; and
a latch having a first input coupled to an output of the first circuit, a second input coupled to an output of the second circuit, and an output to generate the associated control signal.

18. The control unit of claim 14, wherein an enable period of the first master signal and an enable period of the second master signal are mutually exclusive.

19. The control unit of claim 14, wherein for each control signal circuit:

the control signal circuit is configured to enable the associated at least one control signal in response to a transition of only the first master signal; and the control signal circuit is configured to disable the associated at least one control signal in response to a transition of only the second master signal.

* * * * *

UNITED STATES PATENT AND TRADEMARK OFFICE
CERTIFICATE OF CORRECTION

PATENT NO. : 7,263,026 B2 Page 1 of 1
APPLICATION NO. : 11/327247
DATED : August 28, 2007
INVENTOR(S) : Min-Soo Kim et al.

It is certified that error appears in the above-identified patent and that said Letters Patent is hereby corrected as shown below:

Column 7, line 12 claim 1, the word "disable" should read -- disabled --.

Signed and Sealed this

Ninth Day of September, 2008

JON W. DUDAS
*Director of the United States Patent and Trademark Office*